US007982177B2

(12) United States Patent
Nozaki et al.

(10) Patent No.: US 7,982,177 B2
(45) Date of Patent: Jul. 19, 2011

(54) FRONTSIDE ILLUMINATED IMAGE SENSOR COMPRISING A COMPLEX-SHAPED REFLECTOR

(75) Inventors: Hidetoshi Nozaki, Sunnyvale, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 68 days.

(21) Appl. No.: 12/023,797

(22) Filed: Jan. 31, 2008

(65) Prior Publication Data

US 2009/0194671 A1 Aug. 6, 2009

(51) Int. Cl.
H01J 40/14 (2006.01)
H01L 31/0232 (2006.01)
(52) U.S. Cl. .......................... 250/239; 257/436
(58) Field of Classification Search .............. 250/208.1, 250/206, 214.1, 239; 257/291, 292, 294, 257/431, 436
See application file for complete search history.

(56) References Cited

U.S. PATENT DOCUMENTS

| 5,942,771 A * | 8/1999 | Ishimura ........................ 257/184 |
| 6,498,336 B1 * | 12/2002 | Tian et al. ................... 250/214.1 |
| 6,838,715 B1 | 1/2005 | Bencuya et al. |
| 6,894,322 B2 | 5/2005 | Kwan et al. |
| 2003/0025160 A1 | 2/2003 | Suzuki et al. |
| 2006/0076590 A1 * | 4/2006 | Pain et al. ...................... 257/294 |
| 2007/0001100 A1 * | 1/2007 | Hsu et al. .................... 250/214.1 |
| 2007/0052050 A1 | 3/2007 | Dierickx |
| 2007/0200054 A1 * | 8/2007 | Reznik et al. ............... 250/208.1 |
| 2008/0099804 A1 * | 5/2008 | Venezia et al. ................ 257/291 |
| 2009/0050947 A1 * | 2/2009 | Dungan et al. ................ 257/294 |
| 2009/0121305 A1 * | 5/2009 | Pan et al. ....................... 257/436 |

FOREIGN PATENT DOCUMENTS

| EP | 1916714 A | 4/2008 |
| JP | 2006261372 A2 | 9/2006 |
| WO | WO 2009/029429 A | 3/2009 |

OTHER PUBLICATIONS

PCT/US2008/087051, PCT International Search Report and Written Opinion of the International Searching Authority, mailed Apr. 1, 2009, 13 pages.

* cited by examiner

*Primary Examiner* — Que T Le
*Assistant Examiner* — Jennifer Bennett
(74) *Attorney, Agent, or Firm* — Blakely Sokoloff Taylor & Zafman LLP

(57) ABSTRACT

An array of pixels is formed using a substrate, where each pixel has a substrate having an incident side for receiving incident light, a photosensitive region formed in the substrate, and a reflector having a complex-shaped surface. The reflector is formed in a portion of the substrate that is opposed to the incident side such that light incident on the complex-shaped surface of the reflector is reflected towards the photosensitive region.

11 Claims, 6 Drawing Sheets

FRONTSIDE ILLUMINATED IMAGE SENSOR COMPRISING A COMPLEX-SHAPED REFLECTOR

This disclosure relates generally to imaging circuits, and more particularly, but not exclusively, relates to image sensors.

BACKGROUND INFORMATION

Integrated circuits have been developed to reduce the size of components used to implement circuitry. For example, integrated circuits have been using ever-smaller design features, which reduces the area used to implement the circuitry, such that design features are now well under the wavelengths of visible light. With the ever-decreasing sizes of image sensors and the individual pixels that are part of a sensing array, it is important to more efficiently capture incident light that illuminates the sensing array. Thus, more efficiently capturing incident light helps to maintain or improve the quality of electronic images captured by the sensing arrays of ever-decreasing sizes.

BRIEF DESCRIPTION OF THE DRAWINGS

Non-limiting and non-exhaustive embodiments of the disclosure are described with reference to the following figures wherein like reference numerals refer to like parts throughout the various views unless otherwise specified.

DETAILED DESCRIPTION

Figure 1:
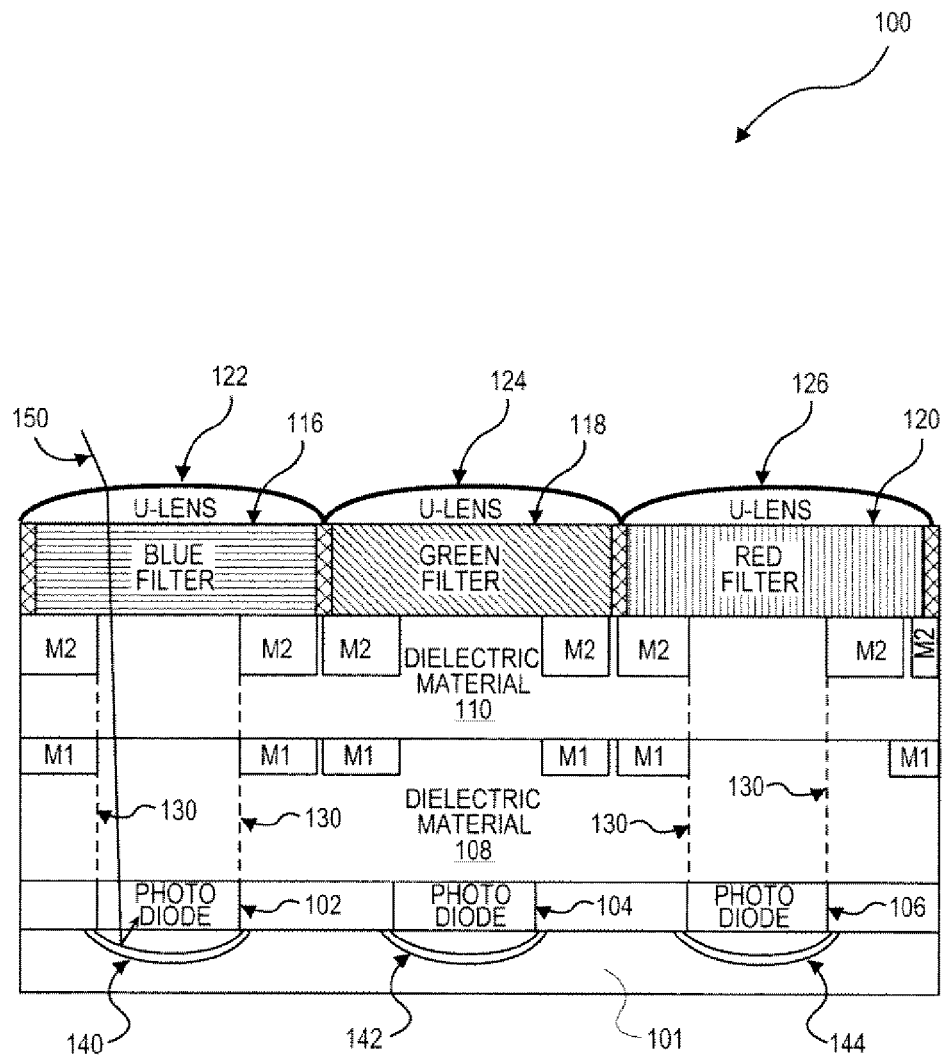
FIG. 1 is an illustration of a side view of a sample frontside illuminated (FSI) image sensor 100.

Embodiments of an image sensor reflector are described herein. In the following description numerous specific details are set forth to provide a thorough understanding of the embodiments. One skilled in the relevant art will recognize, however that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

In general, integrated circuits comprise circuitry that is employed for a variety of applications. The applications use a wide variety of devices such as logic devices, imagers (including CMOS and CCD imagers), and memory (such as DRAM and NOR- and NAND-based flash memory devices). These devices normally employ transistors for a variety of functions, including switching and amplification of signals.

Transistors are typically formed in integrated circuits by photolithographic processes that are performed on a silicon substrate. The processes include steps such as applying a photographic resist layer to the substrate, exposing the resist layer to a pattern using light (including deep ultra-violet wavelengths), removing the exposed portions (or non-exposed portions depending on the photo-positive or photo-negative resists that are used) of the resist by etching, and modifying the exposed structure, for example, by depositing or implanting additional materials to form various structure for electronic components (including transistors).

The term "substrate" includes substrates formed using semiconductors based upon silicon, silicon-germanium, germanium, gallium arsenide, and the like. The term substrate may also refer to previous process steps that have been performed upon the substrate to form regions and/or junctions in the substrate. The term substrate can also include various technologies, such as doped and undoped semiconductors, epitaxial layers of silicon, and other semiconductor structures formed upon of the substrate.

Chemical-mechanical planarization (CMP) can be performed to render the surface of the modified substrate suitable for forming additional structures. The additional structures can be added to the substrate by performing additional processing steps, such as those listed above.

As the size of the image sensors in individual pixels that are part of a sensing array become increasingly smaller, various designs attempt to more efficiently capture the incident light that illuminates the sensing array. For example, the area of the light sensing element (such as a photodiode) of a pixel is typically maximized by arranging a microlens over (or underneath) each pixel so that the incident light is better focused onto the light sensing element. The focusing of the light by the microlens attempts to capture light that would otherwise normally be incident upon a portion of the pixel outside the area occupied by the light sensitive element (and thus lost and/or "leaked" through to other unintended pixels).

Another approach that can be used is to collect light from the "backside" of (e.g., underneath) the CMOS image sensor. Using the backside of the image sensor allows photons to be collected in an area that is relatively unobstructed by the many dielectric and metal layers that are normally used to form a typical image sensor. A backside illuminated (BSI) image sensor can be made by thinning the silicon substrate of the image sensor which reduces the amount of silicon through which incident light traverses before the sensing region of the image sensor is encountered.

However, when thinning the substrate of the image sensor, a tradeoff between the sensitivity of the pixel and crosstalk (with adjacent pixels) is encountered. For example, when less thinning is used (which results in a thicker remaining silicon substrate), a larger (volumetric) region of a photodiode for conversion of light to electron-hole pairs can be provided. When the electron-hole pairs are formed relatively far away (in the larger provided region) from the photodiode depletion region, the formed electron-hole pairs are more likely to be captured by adjacent photodiodes. The capturing of the formed electron-hole pairs by adjacent photodiodes is a normally an undesired effect called blooming (which causes adjacent pixels to appear to be brighter than the "true" value). Accordingly, the probability of blooming increases with the thickness of the silicon substrate, while sensitivity decreases as the thinner silicon substrates are used.

In electronic imagers, light from an illuminated object being imaged can enter from the frontside (FSI) or the backside (BSI) of the imaging device. Within each pixel of the imaging device, some of the incident light is absorbed before reaching the active photodiode of the pixel and some of the incident light passes through without being absorbed in the photodiode. A reflector helps to redirect the non-absorbed incident light towards the photodiode. Reflecting the unabsorbed light towards the photodiode increases the sensitivity of the photodiode and reduces crosstalk and blooming effects.

In accordance with the present disclosure, an array of pixels is formed using a substrate, wherein each pixel has a photodiode and a reflector for reflecting incident light that was not initially absorbed by the photodiode. The reflector is shaped having multiple angles of reflection such that the incident light that has not been initially absorbed by the photodiode is focused and reflected towards the photodiode.

To illustrate, FIG. 1 is a side view of a sample frontside illuminated (FSI) image sensor 100, in accordance with teachings of the present invention. For simplicity, the Figure is not drawn to scale. Generally, the image sensor 100 includes several photosensitive elements arranged in an array of two dimensional rows and columns across a substrate 101. The Figure illustrates three photosensitive elements 102, 104, and 106, which are shown as photodiodes 102, 104, and 106. The array can include hundreds or thousands of rows and/or columns, or more. Additionally, the array can have an arrangement other than rectilinear columns and rows.

The substrate 101 can be a semiconductor substrate. For many embodiments, the substrate 101 is a doped silicon substrate in which photosensitive elements are formed. Each photosensitive element 102, 104, and 106 typically converts light into an electric signal proportional to the intensity of light detected. Each photosensitive element can be a photodiode or other solid state device. Other photosensitive elements also can be used as well. The resulting pixels can include, for example, amplification and readout circuitry such as one or more CMOS transistors (not shown). For purposes of clarity, only reference numbers for photosensitive elements 102, 104, and 106 are illustrated. The photosensitive elements 102, 104, and 106 can be disposed in the substrate 101 in any suitable known manner.

A typical individual pixel in the image sensor 100 can include a stack of multiple layers including metal layers, planarization layers, and the like. As shown, the image sensor 100 includes a first metal layer having M1 conductors disposed in a dielectric material 108. For some embodiments, the first metal layer can be etched into the shape of the M1 metal conductors and the M1 conductors can be planarized by polishing. The dielectric material 108 can be deposited and/or grown to fill the gaps between the M1 conductors. The dielectric material 108 can insulate the M1 conductors from the substrate 101. The dielectric material 108 can be any insulator such as an oxide. For some embodiments, the dielectric material can be a silicon oxide. The M1 conductors can be copper, aluminum, an aluminum copper mixture, or other material suitable (such as polysilicon) for carrying a signal.

As shown, the image sensor 100 includes a second metal layer having M2 conductors disposed in a dielectric material 110. For some embodiments, the second metal layer can be etched into the shape of the M2 conductors and the M2 conductors can be planarized by polishing. The dielectric material 110 can be deposited and/or grown to fill the gaps between the M2 conductors. The dielectric material 110 can insulate the M1 metal conductors from the M2 metal conductors. The dielectric material 110 can be any insulator such as an oxide. For some embodiments, the dielectric material can be a silicon oxide. The M2 conductors can be made of a material suitable for conductors M1.

Additionally, filters are disposed over the layer defined by dielectric material 110. The filters can be aligned with photosensitive elements such that a filter 116 is aligned with the photosensitive element 102, a filter 118 is aligned with the photosensitive element 104, and a filter 120 is aligned with the photosensitive element 106. The dashed lines 130 indicate the alignment of the filters with the photosensitive elements.

The color filters 116, 118, and 120 can be made from any suitable material. One suitable material is an acrylic—such as polymethylmethacrylate (PMMA) or polyglycidylmethacrylate (PGMA)—that has been pigmented or dyed. Other photoresist-type materials that can be dyed or pigmented can also be used for color filters.

In some embodiments, micro-lenses are disposed over the filters. As shown a micro-lens 122 is disposed over the filter 116, a micro-lens 124 is disposed over the filter 118, and a micro-lens 126 is disposed over the filter 120. The micro-lenses are arranged to focus incident light upon the photosensitive elements such that the micro-lens 122 focuses incident light upon the photosensitive element 102, the micro-lens 124 focuses incident light upon the photosensitive element 104, and the micro-lens 126 focuses incident light upon the photosensitive element 106. The micro-lenses, filters, and other layers can be disposed using any suitable deposition, etching, masking technique as well as planarization, heating, reflow, chemical vapor deposition (CVD), plasma enhanced chemical vapor deposition (PECVD), or other suitable technique.

Image sensors are conventionally made using layers in the pixel stack that are substantially flat. In accordance with the present disclosure, a reflector has a complex shape (such as a concave, convex, or trapezoidal shape) having multiple angles of reflection that reflect and focus incident light towards the photosensitive element, Reflector 140 reflects light towards photodiode 102, reflector 142 reflects light towards photodiode 104, and reflector 144 reflects light towards photodiode 106.

To illustrate, incident light 150 that is not absorbed by photodiode 102 impinges reflector 140 and is reflected upwards such that the incident light enters photodiode 102 for a second time to increase the probability that the light will be absorbed. The complex shape of the reflector has multiple angles of reflection such the light is more generally reflected towards a central portion of the photodiode. The potential path of the light for the second time in the photodiode is generally longer than the path traversed by the light during the first traversal (thus even further increasing the chance for absorption).

Although the reflector may be, for example, described as having a convex shape in a cross-section, it is understood that a curved convex shape can be approximated using a plurality of flat surfaces (such as by a trapezoidal cross-section). The formation and operation of the reflector is described in greater detail below with respect to the following Figures.

Figure 2:
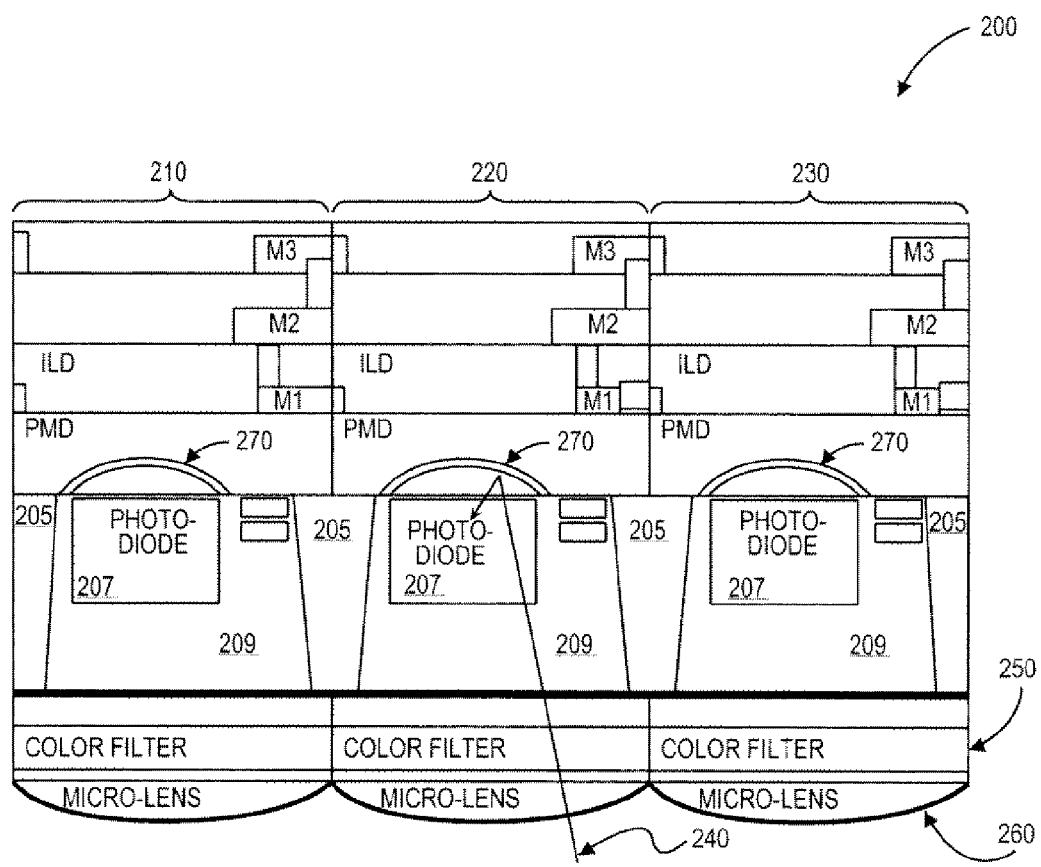
FIG. 2 is an illustration of a cross-section of a sample sensor array of backside illuminated (BSI) pixel of an image sensor.

FIG. 2 is an illustration of a cross-section of a sample sensor array of backside illuminated (BSI) pixel of an image sensor. Array 200 includes pixels 210, 220, and 230. Structure 200 typically contains at least thousands of pixels and often contains more than a million pixels. Three pixels are shown for the purpose of clarity. Each pixel can be separated from other pixels by, for example, a shallow-trench isolation (STI) structure 205.

Each pixel includes metallization layers that are separated by dielectric layers. A primary dielectric layer comprises the reflectors 270. The reflectors 270 can be formed using frontside or backside processing as described below (with respect to FIGS. 3-5). Other (interlayer) dielectric layers that include, for example, three layers of metallization for electrical connectivity.

The pixels of array 200 are typically arranged in a two-dimensional array such that an electronic image can be formed in response to incident light (240) being captured by a photodiode 207 in each pixel. Each pixel can have a filter 250 (including color filters and infra-red filters) such that the electronic image can be used to capture color images or increase the sensitivity of the pixel to certain wavelengths of light, for example.

Each pixel can also have a micro-lens 260 associated with each pixel such that the incident light is more directly guided into the pixel. As shown, incident light 240 (which illuminates pixel 220 from the backside) traverses the micro-lens 260 and a color filter 250, which allows light of the selected color to pass through. The light traverses substrate 209 of the pixel and enters photodiode 207. In the example the light is not absorbed by photodiode 207 and enters layer 202 where the light is reflected by reflector 270. The light is directed towards photodiode 207 to be absorbed (e.g. detected).

Figure 3A:
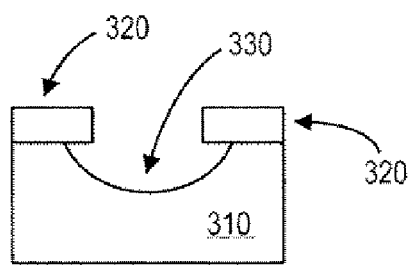
FIG. 3 is an illustration in cross-section of a sample process for forming a reflector in a concave surface.

FIG. 3 is an illustration in cross-section of a sample process for forming a reflector in a concave (female) surface. FIG. 3A includes a substrate 310 upon which a mask 320 is patterned. A wet etch (such as buffered hydrofluoric acid) can be used to isotropically etch substrate 310 (such as a silicon substrate). The isotropic etch results in a concave-shaped surface 330 having rounded sidewalls. The mask 320 can be removed using an etch that is selective to the mask.

Figure 3B:
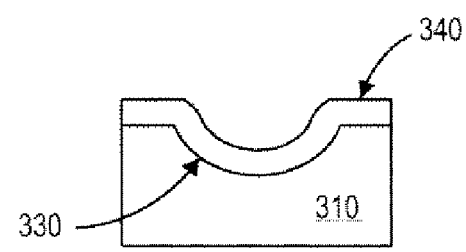

FIG. 3B shows the concave-shaped surface 330 formed within substrate 310. A reflective layer 340 is conformally deposited across the face of concave-shaped surface 330. The reflective layer 340 is typically a reflective metal such as aluminum or tungsten. The reflective layer 340 can be patterned and etched so as to selectively conduct electricity (e.g., as in a ground plane).

Figure 3C:
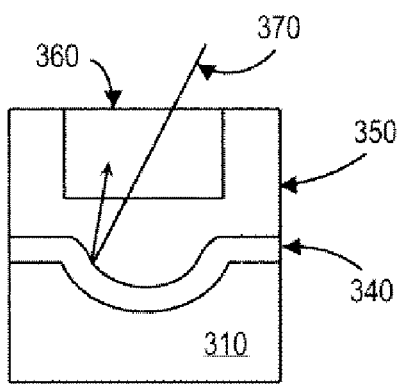

FIG. 3C illustrates a deposition layer 350 (such as polycrystalline silicon) in which photodiode 360 is formed. As illustrated, incident light 1370 passes through photosensitivity diode 360 without being absorbed. The incident light 370 encounters the reflective layer 340 and is reflected towards the photodiode 360 for absorption by the photodiode 360.

It can be seen that the process disclosed above can be performed using "frontside" processing, where the reflector is formed on the "backside" of the photodiode (as illustrated by element 140 of FIG. 1). The process can be performed using "backside" processing, where the reflector is formed above (e.g., on the frontside of) the photodiode (as illustrated by element 270 of FIG. 2).

Figure 4A:
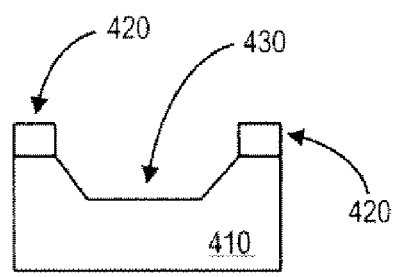
FIG. 4 is an illustration in cross-section of a sample process for forming a reflector in a concave trapezoidal cavity.

FIG. 4 is an illustration in cross-section of a sample process for forming a reflector in a concave trapezoidal cavity. FIG. 4A includes a substrate 410 upon which a mask 420 is patterned. An anisotropic wet etch (such as tetramethlyammonium hydroxide) can be used to anisotropically etch substrate 410 (such as a silicon substrate), which results in a trapezoidal shape 430 (due to differing directional etching rates of the silicon crystal substrate). The mask 420 can be removed using an etch that is selective to the mask.

Figure 4B:
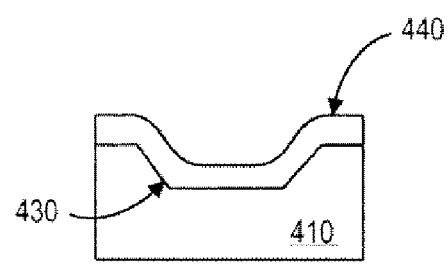

FIG. 4B illustrates the trapezoidal cavity 430 that is formed within substrate 410. A reflective layer 440 is conformally deposited across the face of trapezoidal shape 430. The reflective layer 440 is typically a reflective metal such as aluminum or tungsten. The reflective layer 440 can be patterned and etched so as to selectively conduct electricity (e.g., as in a ground plane).

Figure 4C:
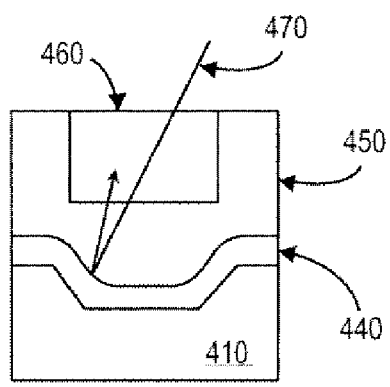

FIG. 4C illustrates a deposition layer 450 (such as polycrystalline silicon) in which photodiode 460 is formed. As illustrated, incident light 470 passes through photodiode 460 without being absorbed. The incident light 470 encounters the reflective layer 440 and is reflected towards the photodiode 460 to be absorbed by the photodiode 460.

It can be seen that the process disclosed above can be performed using "frontside" processing, where the reflector is formed on the "backside" of the photodiode (as illustrated by element 140 of FIG. 1). The process can be performed using "backside" processing, where the reflector is formed above (e.g., on the frontside of) the photodiode (as illustrated by element 270 of FIG. 2).

FIG. 5 is an illustration of a sample process for forming a reflector on a convex (male) surface. FIG. 5A is a cross-section view that includes a substrate 510 upon which a mask 520 is patterned. FIG. 5F is a top-view of FIG. 5A showing the aperture 530 as, for example, an annular shape ("race track"). A wet etch (such as buffered hydrofluoric acid) can be used to isotropically etch substrate 510 (such as a silicon substrate), which results in a concave-shaped surface 530 having rounded sidewalls. The mask 520 is removed using an etch that is selective to the mask, which shows a surface, in cross-section, having a center portion with relatively sharp edges as shown in cross-section in FIG. 5B.

Figure 5A:
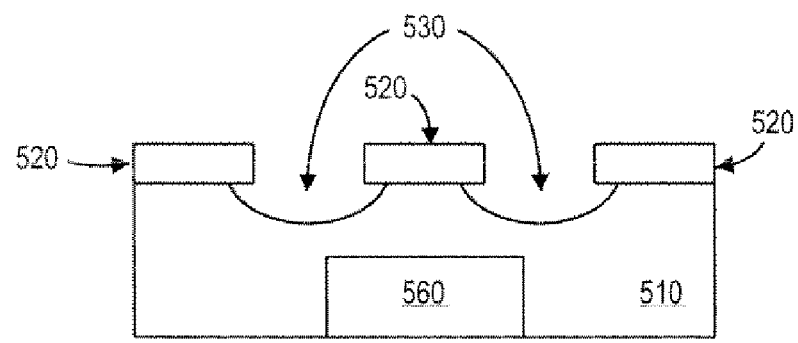
FIG. 5 is an illustration of a sample process for forming a reflector on a convex surface.
Figure 5B:
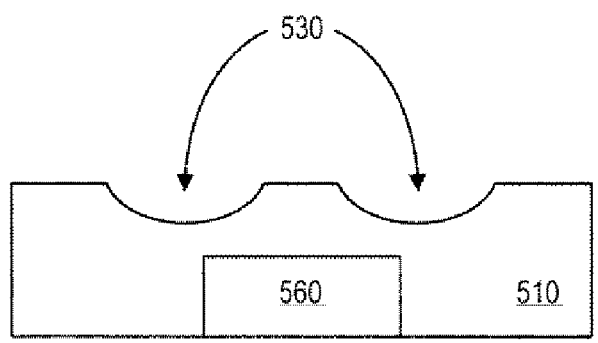
Figure 5C:
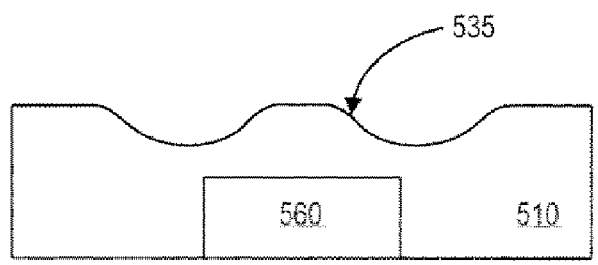

In FIG. 5C, an etch is applied to the surface of the substrate of FIG. 5B. The etch "rounds off" the relatively sharp edges of the surface, which results in a rounded convex-shaped surface 535. A reflective layer 540 can be non-conformally deposited across the face of convex-shaped surface 535. The reflective layer 540 is typically a reflective metal such as aluminum or tungsten. The reflective layer 540 can be patterned and etched so as to selectively conduct electricity (e.g. as in a ground plane).

Figure 5D:
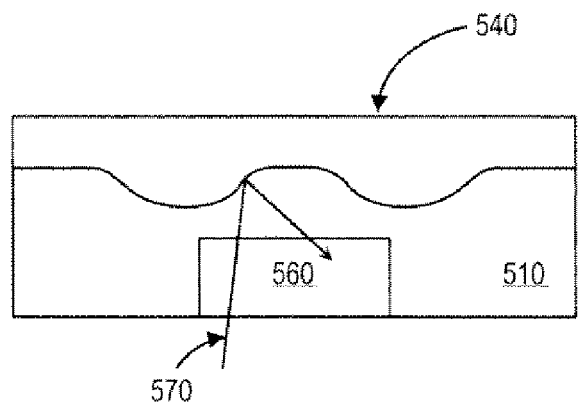

FIG. 5D illustrates the operation of the convex reflector. As illustrated, incident light 570 passes through photodiode 560 without being absorbed. The incident light 570 is reflected back by the reflective layer 540 towards the photodiode 560 to be detected by the photodiode 560.

Figure 5E:
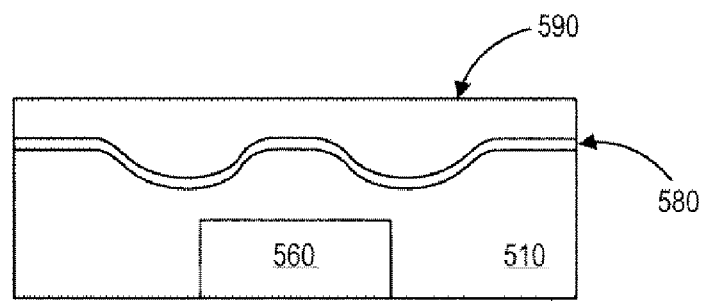
Figure 5F:
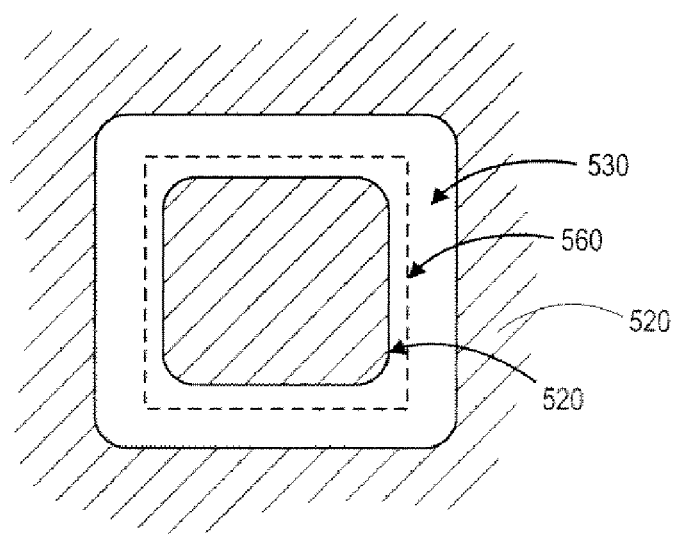

In another embodiment, the reflective layer can be conformally coated. FIG. 5E illustrates a reflective layer 580 that is conformally deposited across the face of convex-shaped substrate. A planarization layer 590 can be added to planarize the surface of the resulting structure and to insulate the metal of the reflective layer. The reflector formed by the conformally coated reflective layer 580 functions similarly to the reflector described in FIG. 5D.

It can be seen that the process disclosed herein can be performed using "frontside" processing, but where the pixel is illuminated from the "backside" of the photodiode (as illustrated by element 270 of FIG. 2). The process can be performed using "backside" processing, where the pixel is illuminated from the frontside of the photodiode (as illustrated by element 140 of FIG. 1).

The above description of illustrated embodiments of the invention, including what is described in the Abstract is not intended to be exhaustive or to limit the invention to the precise forms disclosed. While specific embodiments of and examples for, the invention are described herein for illustrative purposes, various modifications are possible within the scope of the invention as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A frontside illuminated image sensor, comprising:
   a doped silicon substrate layer having a complex-shaped surface;
   a stack of metal layers disposed over the doped silicon substrate layer;
   a silicon layer disposed between the doped silicon substrate layer and the stack of metal layers, the silicon layer having a light incident side facing the stack of metal layers and an opposite side facing the doped silicon substrate layer, the silicon layer disposed over the complex-shaped surface of the doped silicon substrate layer and being a single layer that is distinct from the doped silicon substrate layer;
   a plurality of photosensitive regions disposed within the silicon layer; and
   reflectors disposed at an interface between the doped silicon substrate layer and the silicon layer at the complex-shaped surface,
   wherein at least one side of the reflector layers conforms to the complex-shaped surface of the doped silicon substrate layer,
   wherein the reflectors are disposed on the opposite side of the silicon layer as the light incident side,
   wherein the complex-shaped surface is oriented such that light incident on the complex-shaped surface of the reflectors after passing through the stack of metal layers and the photosensitive regions is reflected back towards the photosensitive regions.

2. The frontside illuminated image sensor of claim 1, wherein the complex-shaped surface is convex.

3. The frontside illuminated image sensor of claim 1, wherein the complex-shaped surface is concave.

4. The frontside illuminated image sensor of claim 1, wherein the complex-shaped surface is trapezoidal.

5. The frontside illuminated image sensor of claim 1, wherein the reflectors are formed before the photosensitive region is formed.

6. The frontside illuminated image sensor of claim 1, wherein the photosensitive regions are formed before the reflectors are formed.

7. The frontside illuminated image sensor of claim 1, wherein the reflectors each have a convex complex-shaped surface that is formed before the photosensitive regions.

8. The frontside illuminated image sensor of claim 1, wherein the reflectors each have a concave complex-shaped surface that is formed before the photosensitive regions.

9. The frontside illuminated image sensor of claim 1, wherein the reflectors each have a trapezoidal complex-shaped surface that is formed before the photosensitive regions.

10. The frontside illuminated image sensor of claim 1, wherein the reflectors each have a concave complex-shaped surface that is formed during frontside processing.

11. The frontside illuminated image sensor of claim 1, wherein the complex-shaped surface is formed during backside processing.

* * * * *